US008080821B2

(12) United States Patent
Taylor (10) Patent No.: US 8,080,821 B2
(45) Date of Patent: Dec. 20, 2011

(54) THYRISTOR RADIATION DETECTOR ARRAY AND APPLICATIONS THEREOF

(75) Inventor: Geoff W. Taylor, Mansfield, CT (US)

(73) Assignees: The University of Connecticut, Farmington, CT (US); Opel, Inc., Shelton, CT (US)

( * ) Notice: Subject to any disclaimer, the term of this patent is extended or adjusted under 35 U.S.C. 154(b) by 808 days.

(21) Appl. No.: 12/050,321

(22) Filed: Mar. 18, 2008

(65) Prior Publication Data
US 2010/0123121 A1 May 20, 2010

(51) Int. Cl.
*H01L 29/15* (2006.01)
(52) U.S. Cl. .......... 257/21; 257/116; 257/E29.072; 257/E31.019
(58) Field of Classification Search ........ 257/21, 257/113, E29.212, E29.072, 23, 24, E31.019, 257/116, 187, 192, 12
See application file for complete search history.

(56) References Cited

U.S. PATENT DOCUMENTS 5,604,695 A * 2/1997 Cantin et al. ............... 356/121
7,012,274 B2   3/2006 Taylor

2004/0079971 A1 * 4/2004 Taylor ..................... 257/215
* cited by examiner

*Primary Examiner* — Thomas L Dickey
*Assistant Examiner* — Fazli Erdem
(74) *Attorney, Agent, or Firm* — Gordon & Jacobson, PC (57) ABSTRACT

An array of thyristor detector devices is provided having an epitaxial growth structure with complementary types of modulation doped quantum well interfaces located between a P+ layer and an N+ layer. The thyristor detector devices operate over successive cycles that each include a sequence of two distinct modes: a setup mode and a signal acquisition mode. During the setup mode, the n-type quantum well interface and/or the p-type quantum well interface is(are) substantially emptied of charge. During the signal acquisition mode, photocurrent is generated by the thyristor detector device in response to the absorption of incident electromagnetic radiation therein, which can induce the thyristor detector device to switch from an OFF state to an ON state. The OFF/ON state of the thyristor detector device produces an output digital electrical data that corresponds to the amount of incident radiation absorbed by the thyristor detector device during the signal acquisition mode of the current cycle. In the preferred embodiment, the array of thyristor detector devices is part of a monolithic integrated circuit that includes additional electronic circuitry and/or optical components. Moreover, the array of thyristor detector devices is preferably part of a monolithic integrated circuit for high angular resolution laser irradiation detection.

28 Claims, 6 Drawing Sheets

THYRISTOR RADIATION DETECTOR ARRAY AND APPLICATIONS THEREOF

BACKGROUND OF THE INVENTION

1. Field of the Invention

The present invention relates to semiconductor devices. More particularly, the present invention relates to semiconductor devices that generate electrical signals in response to incident radiation. The invention is particularly applicable to devices that determine the angle-of-arrival of an incident laser beam with high angular resolution (typically referred to as a "HARLID").

2. State of the Art

A Laser Warning Receiver (LWR) is an important asset of modern military forces for protecting vehicles, weapon platforms, and/or personnel against laser guided weapons. The LWR employs a device that determines the angle-of-arrival of an incident laser beam with high angular resolution (typically referred to as a "HARLID") in order to accurately locate the laser guided weapon and optimize countermeasures against such laser guided weapon.

The angle-of-arrival of the incident laser beam is typically measured by a device that employs a mask that blocks incident radiation (within the spectral range of interest). The mask includes one or several apertures positioned above at least one array of radiation detectors. The apertures (sometimes referred to as windows or slots) allow the incident radiation to pass through the mask for detection by the radiation detectors. The angle-of-arrival of the incident laser beam is determined from the position where the aperture(s) is(are) imaged onto the radiation detectors. For increased spectral sensitivity, two separate arrays of radiation detectors are commonly used (i.e., an array of silicon photodiodes and an array of GaAs photodiodes), which significantly increases the cost of the device. Moreover, the outputs of the radiation detectors of the device are processed by signal processing circuitry in order to determine the angle-of-arrival of the incident laser beam. Such signal processing circuitry is complex and expensive to develop and manufacture, which also adds to the costs of the device.

SUMMARY OF THE INVENTION

It is therefore an object of this invention to provide an array of radiation detectors, preferably utilizing a III-V semiconductor system, which can be adapted to absorb electromagnetic radiation in a broad spectral range (preferably between 500 nm and 1650 nm).

It is another object of this invention to provide an array of radiation detectors which can be adapted to efficiently generate digital electrical signals representative of the detection of incident radiation.

It is an additional object of this invention to provide such an array of radiation detectors as part of a monolithic integrated circuit that includes additional electronic circuitry (preferably HFET transistors) and/or optical components.

It is yet another object of this invention to implement such an array of radiation detectors as part of a monolithic integrated circuit for high angular resolution laser irradiation detection.

In accord with the objects of the invention, an array of thyristor detector devices (and corresponding method of operation) is provided having complementary types of modulation doped quantum well interfaces disposed between P+ layer(s) and an N+ layer(s). The first-type modulation doped quantum well structure (referred to as the "n-type modulation doped quantum well interface") creates an inversion channel for the electrons, while the second-type modulation doped quantum well structure (referred to as the "p-type modulation doped quantum well interface") creates an inversion channel for holes. The complementary modulation doped quantum well interfaces are separated from one another by at least one undoped spacer layer disposed therebetween.

In a preferred embodiment, the thyristor detector devices of the array are metallized as follows. For each thyristor detector device, a refractory anode terminal is formed adjacent the highly doped top P+ layer, a cathode terminal is operably coupled to a bottom N+ layer, and preferably an n-channel injector terminal and/or a p-channel injector terminal are operably coupled to the n-type and p-type modulation doped quantum well interfaces, respectively.

The thyristor detector devices of the array operate over successive cycles that each include a sequence of two distinct modes: a setup mode and a signal acquisition mode. During the setup mode, the n-type quantum well interface and/or the p-type quantum well interface is(are) substantially emptied of charge. Such operations reset the thyristor detector device into an OFF state if it was switched ON during the signal acquisition mode of the previous cycle. During the signal acquisition mode, photocurrent is generated by the thyristor detector device in response to the absorption of incident electromagnetic radiation therein. The photocurrent can induce the thyristor detector device to switch from an OFF state to an ON state. Once switched into the ON state, the thyristor detector device remains in the ON state until it is reset in the setup mode of the next cycle. The OFF/ON state of the thyristor detector device at the end of signal acquisition mode produces an output digital electrical data that corresponds to the amount of incident radiation absorbed by the thyristor detector device during the signal acquisition mode of the current cycle.

In the preferred embodiment, the n-type and p-type modulation doped quantum well interfaces of the thyristor devices of the array absorb electromagnetic radiation in the near-infrared range from 980 nm to 1650 nm and the undoped spacer layer disposed between the n-type and p-type modulation doped quantum well interfaces absorbs electromagnetic radiation in the visible range from 500 nm to 750 nm in addition to the near-infrared range from 750 nm to 980 nm, thus providing spectral sensitivity of the thyristor detector devices over a broad range from 500 nm to 1650 nm.

In the preferred embodiment, the array of thyristor detector devices is part of a monolithic integrated circuit that includes additional electronic circuitry and/or optical components. Such additional electronic circuitry preferably includes HFET transistors, which can be used to realize circuitry supporting the operation of the thyristor detector devices (e.g., load bias resistance and/or current sources for charge injection/removal for sensitivity adjustment) as well as digital logic circuitry for processing the output of the thyristor detector devices. Such optical components can include optical transmitters, optical receivers, optical transceivers for optical communications and other functions associated therewith (such as optical amplification, optical modulation, etc.)

Moreover, the array of thyristor detector devices is preferably part of a monolithic integrated circuit for high angular resolution laser irradiation detection.

Additional objects and advantages of the invention will become apparent to those skilled in the art upon reference to the detailed description taken in conjunction with the provided figures.

DETAILED DESCRIPTION

In accordance with the present invention, an array of thyristor radiation detectors (thyristor detector devices) is provided that includes complementary modulation doped quantum well interfaces formed between P+ layer(s) and N+ layer(s). In the preferred embodiment, each thyristor detector device is formed from a mesa that includes a refractory anode terminal formed adjacent the highly doped top P+ layer structure. A cathode terminal is operably coupled to a bottom N+ layer. An n-channel injector terminal and/or a p-channel injector terminal are operably coupled to the n-type and p-type modulation doped quantum well interfaces, respectively.

The thyristor detector devices of the array operate over successive cycles each including a sequence of two distinct modes: a setup mode and a signal acquisition mode. During the setup mode, the n-type quantum well interface and/or the p-type quantum well interface is(are) substantially emptied of charge. Such operations reset the thyristor detector device into an OFF state if it was switched ON during the signal acquisition mode of the previous cycle. During signal acquisition mode, photocurrent is generated by the thyristor detector device in response to the absorption of incident electromagnetic radiation therein. The photocurrent can induce the thyristor detector device to switch from an OFF state to an ON state. Once switched into the ON state, the thyristor detector device remains in the ON state until it is reset in the setup mode of the next cycle. The OFF/ON state of the thyristor detector device at the end of signal acquisition mode produces an output digital electrical data that corresponds to the amount of incident radiation absorbed by the thyristor detector device during the signal acquisition mode of the current cycle.

In the preferred embodiment, the n-type and p-type modulation doped quantum well interfaces of the thyristor devices of the array absorb electromagnetic radiation in the near-infrared range from 980 nm to 1650 nm and the undoped spacer layer disposed between the n-type and p-type modulation doped quantum well interfaces absorbs electromagnetic radiation in the visible range from 500 nm to 750 nm in addition to the near-infrared range from 750 nm to 980 nm, thus providing spectral sensitivity of the thyristor detector devices over a broad range from 500 nm to 1650 nm.

The thyristor detector array of the present invention (and the signals produced therefrom) can be used in many applications. For example, it can be used as part of a High Angular Resolution Laser Irradiation Detector (HARLID) to detect the angle-of-arrival a collimated laser beam with high angular resolution.

Preferably, the thyristor detector array of the present invention (and possibly other optoelectronic devices, logic circuits and/or signal processing circuits that are fabricated integral thereto) are realized from the inversion quantum-well channel device structures similar to those described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002; U.S. patent application Ser. No. 10/323,388, filed on Dec. 19, 2002; U.S. patent application Ser. No. 10/340,942, filed on Jan. 13, 2003; all of which are hereby incorporated by reference in their entireties. With these structures, a fabrication sequence is used to make all the devices, including the imaging array, electrical devices (e.g., transistors) and optoelectronic devices (e.g., laser/detector/modulator) on a common substrate. In other words, n type and p type contacts, critical etches, etc. are used to realize all of these devices simultaneously on a common substrate. The essential features of this device structure include 1) an n-type modulation doped interface and a p-type modulation doped quantum well interface, 2) self-aligned n-type and p-type channel contacts formed by ion implantation, 3) n-type metal contacts to the n-type ion implants and the bottom n-type layer structure, and 4) p-type metal contacts to the p-type ion implants and the top p-type layer structure.

Figure 2:
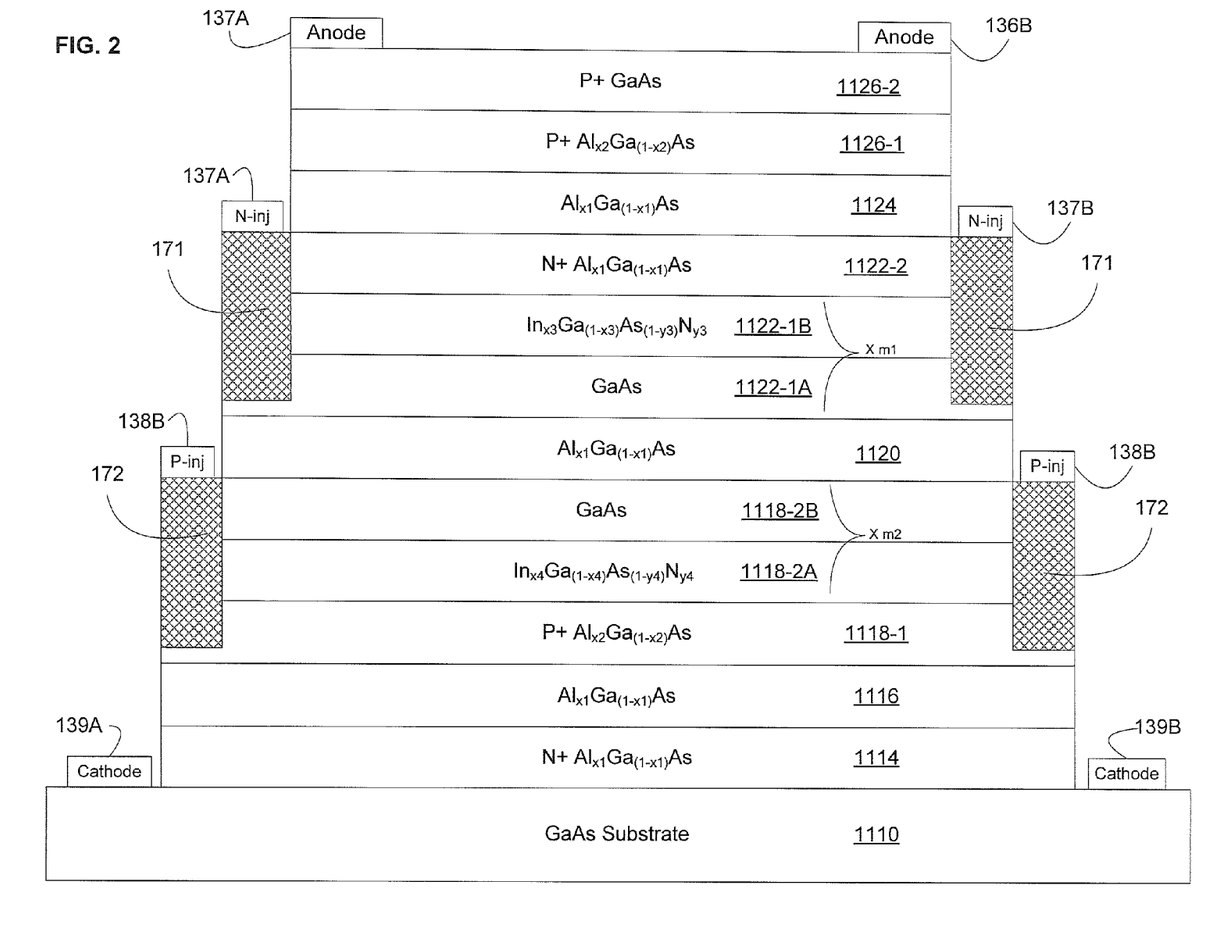
FIG. 2 illustrates an exemplary epitaxial growth structure utilizing group III-V materials for realizing the thyristor detector devices of FIGS. 1A and 1B in accordance with the present invention; other optoelectrical/electrical/optical devices can be monolithically integrated as part of this structure.

The state of the charge in the n-type modulation doped quantum well interface and p-type modulation doped quantum well interface is controlled by conduction from either the anode or cathode as dictated by the bias conditions of the thyristor device. In addition, charge may be removed from the n-type modulation doped quantum well interface and p-type modulation doped quantum well interface by a current source (or pulse source) electrically coupled to the injector terminal for the respective interface. In the preferred embodiment, the metal anode is separated into two sections which are connected electrically by the P+ layer along the top surface (FIG. 2). The active region of the device lies below the aperture formed by the two metal anode sections.

Figure 1A:
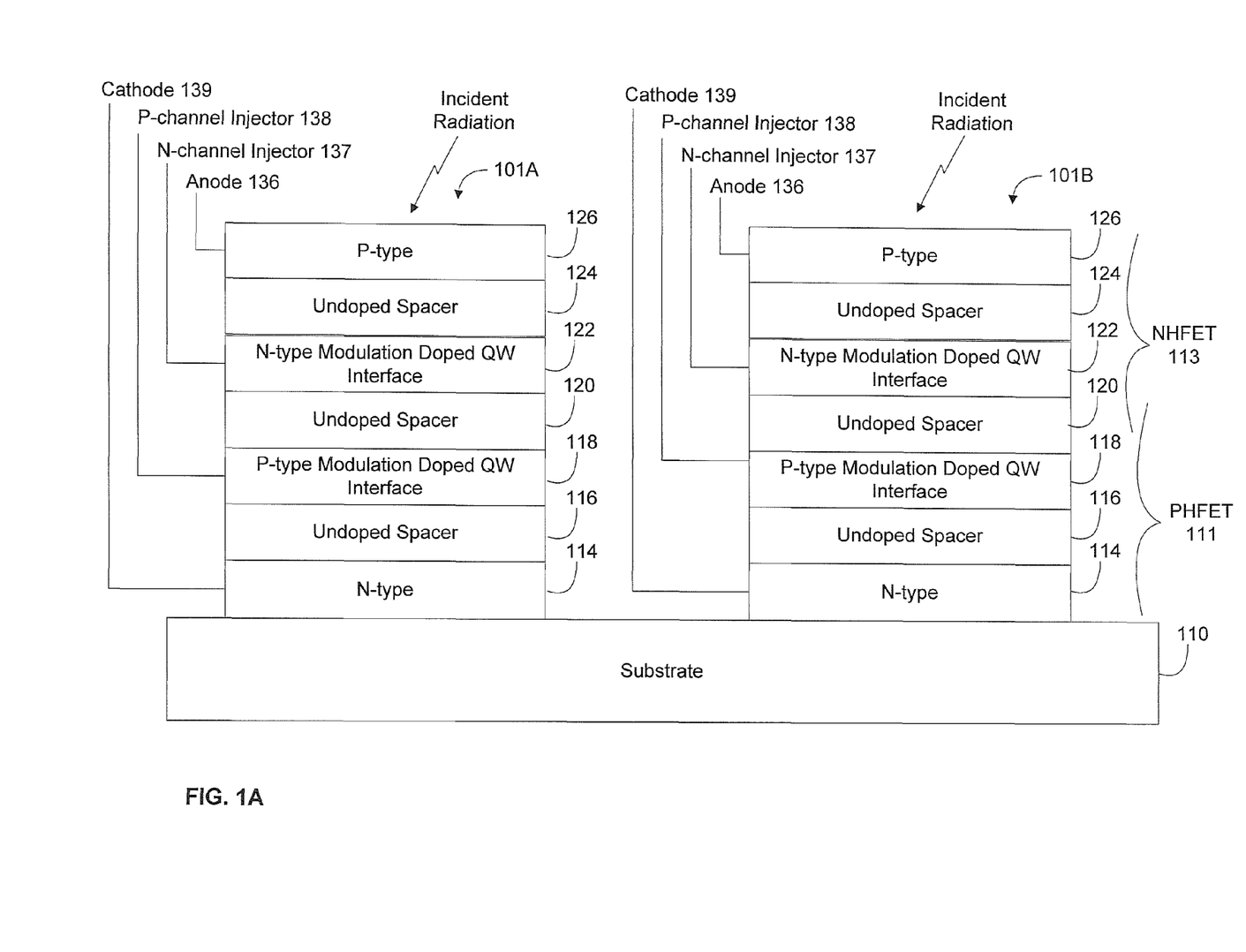
FIG. 1A is a schematic view showing two exemplary thyristor detector devices integrated on a common substrate in accordance with the present invention.
Figure 1B:
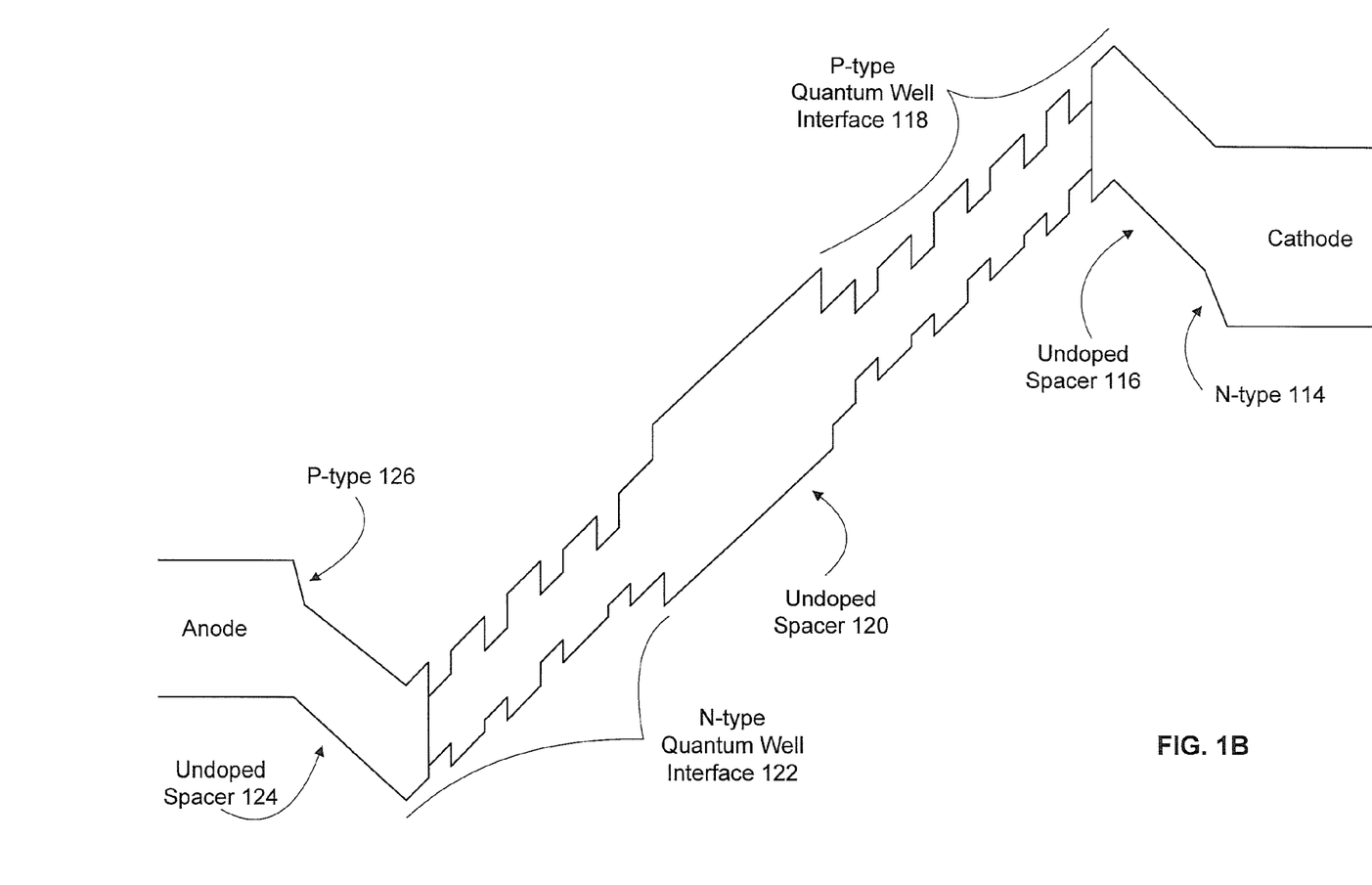
FIG. 1B is an energy band diagram of the thyristor detector devices of FIG. 1A.

The structure of the two thyristor detector devices 101A, 101B is illustrated in FIG. 1A. FIG. 1B illustrates an exemplary energy band diagram for the thyristor detector devices 101A, 101B of FIG. 1A. Note that the general layer structure of FIG. 1A can be configured to operate as a wide range of electronic devices (e.g., field effect transistors, bipolar transistors) such that these devices can be integrated to form a monolithic integrated circuit as described herein. The structure includes an active device structure which logically consists of two HFET devices. The first of these is a p-channel HFET device 111 (referred to herein as PHFET 111) comprising layers 114, 116, 118, and 120. The PHFET device 111, which has a p-type modulation doped quantum well interface, is positioned with the gate terminal on the lower side and the collector terminal on the upper side. The second of these is an n-channel HFET device 113 (referred to herein as NHFET 113) comprising layers 120, 122, 124, and 126. The NHFET device 113 has an n-type modulation doped quantum well interface and is positioned with the gate terminal on the top side and the collector terminal on the lower side which is the collector of the p-channel device. Therefore a non-inverted n-channel device is stacked upon an inverted p-channel device to form the active device structure.

The active device layer structure begins with n-type layer(s) 114. Preferably, n-type layer(s) 114 include a heavily doped layer that should not be depleted in any range of operation of the device, i.e. the total doping in this layer should exceed the total doping charge contained in the modulation doped layer of the p-type modulation doped quantum well interface 118 described below. Deposited on layer 114 is an undoped spacer layer 116. Layers 114 and 116 serve electrically as part of the gate of the PHFET 111. In this configuration, layer 114 achieves low contact resistance and layer 116 defines the capacitance of the PHFET 111 with respect to the p-type modulation doped quantum well interface 118. Deposited on layer 116 is a p-type modulation doped quantum well interface 118 that defines one or more quantum wells (which may be formed from strained or unstrained heterojunction materials) spaced apart from a p-type modulation doped layer. Deposited on the p-type modulation doped quantum well interface 118 is an undoped spacer layer 120, which forms the collector of the PHFET 111. All of the layers grown thus far form the PHFET 111 with the gate ohmic contact on the bottom.

Undoped spacer layer 120 forms the collector region of the NHFET 113. Deposited on layer 120 is an n-type modulation doped quantum well interface 122 that defines one or more quantum wells (which may be formed from strained or unstrained heterojunction materials) spaced apart from an n-type modulation doped layer. Deposited on the n-type modulation doped quantum well interface 122 is an undoped spacer layer 124. Deposited on layer 124 are p-type layer(s) 126. Preferably, the p-type layer(s) 126 include a heavily doped layer that should not be depleted in any range of operation of the device, i.e. the total doping in this layer should exceed the total doping charge contained in the modulation doped layer of the n-type modulation doped quantum well structure 122 described above. In addition, the p-type layer(s) 126 preferably include at least one layer which enables the formation of ohmic contacts thereto. In this configuration, layer(s) 126 achieves low contact resistance and layer 124 defines the capacitance of the NHFET 113 with respect to the n-type modulation doped quantum well interface 122. Layers 124, 126 and 128 serve as part of the gate of the NHFET 113.

Alternatively, the active device structure may be described as a pair of stacked quantum-well-base bipolar transistors formed on the substrate 110. The first of these is an n-type quantum-well-base bipolar transistor (comprising layers 114, 116, 118, and 120) which has one or more quantum wells spaced apart from a p-type modulation doped layer and is positioned with the emitter terminal on the lower side (i.e. on the mirror as just described) and the collector terminal on the upper side. The second of these is an n-type quantum-well-base bipolar transistor comprising layers 120, 122, 124, and 126. This n-type quantum-well-base bipolar transistor has one or more quantum wells spaced apart from an n-type modulation doped layer and is positioned with the emitter terminal on the top side and the collector terminal on the lower side (which is the collector of the p-type quantum-well-base bipolar transistor). Therefore a non-inverted n-channel device is stacked upon an inverted p-channel device to form the active device structure. In this configuration, the gate terminal of the p-channel HFET device 111 corresponds to the emitter terminal of the p-type quantum-well-base bipolar transistor, the p-type quantum well interface 118 corresponds to the base region of the p-type quantum-well-base bipolar transistor, spacer layer 120 corresponds to the collector region of both the p-type quantum-well-base bipolar transistor and the n-type quantum-well-base bipolar transistor, the n-type quantum well interface 122 corresponds to the base region of the n-type quantum-well-base bipolar transistor, and the gate terminal of the n-channel HFET device 113 corresponds to the emitter electrode of the n-type quantum-well-base bipolar transistor.

The thyristor detector devices 101A, 101B are adapted to perform a successive radiation detection cycles each including a setup mode and a signal acquisition mode.

In the setup mode, the n-type modulation doped quantum well interface 122 and the p-type quantum well interface 116 of the thyristor detector elements 101A, 101B are emptied of charge, thereby forcing both the n-type modulation doped quantum well interface 122 and the p-type quantum well interface 118 into a state of deep depletion. Such operations reset the thyristor detector device into an OFF state if it was switched ON during the signal acquisition mode of the previous cycle. Preferably, this is accomplished by i) applying a current source to an n-channel injector terminal that contacts the n-type modulation doped quantum well interface 122 for emptying the n-type modulation doped quantum well interface 122 of free electrons, and ii) applying a current source to a p-channel injector terminal that contacts the p-type modulation doped quantum well interface 116 for emptying the p-type modulation doped quantum well interface 116 of free holes. During the setup mode, electronic shutter control circuitry is preferably coupled to the cathode terminal electrode of the thyristor detector and maintains the cathode terminal electrode in a high impedance state (i.e., in other words the cathode terminal electrode floats) to disable induction from the cathode terminal.

In the signal acquisition mode, incident radiation is absorbed in both the n-type modulation doped quantum well interface 122 and the p-type modulation doped quantum well interface 118 of the thyristor detector device. Similar to the absorption process described in U.S. application Ser. No. 10/689,019, the absorbed radiation will empty the quantum well of the p-type quantum well interface 118, thus accumulating positive charge in the p-type modulation doped layer and producing a forward bias on the p-type quantum well barrier, which results in a electron current flow over the p-type barrier to the n-type modulation doped quantum well interface 122. Radiation absorbed in the n-type quantum well interface 122 will empty the quantum well of the interface 122, thus accumulating negative charge in the n-type modulation doped layer and producing a forward bias on the n-type quantum well barrier, which results in a hole current flow over the n-type barrier to the p-type modulation doped quantum well interface 118.

The incident radiation can also be absorbed in the undoped spacer layer 120 of the thyristor detector device, which creates electrons and holes that are swept from the undoped spacer layer 20 by the built-in electric field between the n-type modulation doped quantum well interface 122 and the p-type modulation doped quantum well interface 118. This field sweeps holes (i.e., hole current) toward the n-type modulation doped quantum well interface 122 and electrons (i.e., electron current) toward the p-type modulation doped quantum well interface 118.

The current caused by absorption of incident radiation, referred to herein as photocurrent, can cause the thyristor detector device to switch from an OFF state (where substantially no current passes through the thyristor device from the anode terminal to the cathode terminal) to an ON state (where current passes through the thyristor device from the anode terminal to the cathode terminal). The thyristor detector device switches from the OFF state to the ON state in the even that photocurrent produces the critical switching charge $Q_{CR}$ in the n-type modulation doped quantum well interface 122 and/or the p-type modulation doped quantum well interface 118. The sensitivity of the thyristor device in switching between states during the signal integration mode is preferably controlled by the supply of current to the n-type modulation doped quantum well interface 122 and/or to the p-type modulation doped quantum well interface 118. Once switched into the ON state, the thyristor detector device remains in the ON state until it is reset in the setup mode of the next cycle. The OFF/ON state of the thyristor detector device at the end of signal acquisition mode produces an output digital electrical data that corresponds to the amount of incident radiation absorbed by the thyristor detector device during the signal acquisition mode for the current cycle.

Preferably, the radiation detection operations of the signal acquisition mode are accomplished by maintaining the voltage level at the anode terminal electrode at a positive voltage (e.g., on the order of three volts). In addition, electronic shutter circuitry coupled to the cathode terminal electrode of the thyristor detector device couples the cathode terminal electrode to ground through a bias resistance (not shown) to enable conduction from the cathode terminal.

The active device structures described above are preferably realized with a material system of group III-V materials (such as a GaAs/AlGaAs). FIG. 2 illustrates an exemplary epitaxial growth structure utilizing group III-V materials for realizing the structure of FIG. 1A and electrical devices (e.g., HFET devices) formed from this structure in accordance with the present invention.

The structure of FIG. 2 can be made, for example, using known molecular beam epitaxy (MBE) techniques. As shown, the structure begins by depositing a layer 1114 of N+ type $Al_{x2}Ga_{(1-x2)}As$ upon a semi-insulating gallium arsenide substrate 1110. The N+$Al_{x2}Ga_{(1-x2)}As$ layer 1114 should not be depleted in any range of operation of the device, i.e. the total doping in this layer should exceed the total doping charge contained in the modulation doped layer of the p-type modulation doped quantum well interface as described below. The parameter x2 is preferably in the range between 70% and 80% (for example, on the order of 70%) for layer 1114. Deposited on layer 1114 are three layers 1116, 1118-1, 1118-2 of $Al_{x1}Ga_{(1-x1)}As$. The parameter x1 is preferably on the order of 15%. Layer 1116 is undoped and has a thickness on the order 300 Å. Layers 1114 and 1116 serve as part of the gate of the PHFET 111. Layer 1118-1 is doped P+ type in the form of delta doping and it forms the modulation doped layer of the p-type modulation doped quantum well interface 118. Layer 1118-2 is undoped and forms a spacer layer between the modulation doped layer and the quantum wells of the p-typed modulation doped quantum well interface. The next layers define the quantum wells that form the inversion channel(s) during operation of the PHFET 111, which include a quantum well layer 1118-3A and a barrier layer 1118-3B of undoped GaAs. The quantum well layer 1118-3A may be comprised of a range of compositions. In the preferred embodiment, the quantum well is formed from an InGaAsN composition with the nitrogen content varying from 0% to 5% depending upon the desired wavelength of radiation that will be absorbed by the quantum well. The combination of the quantum well layer 1118-3A and barrier layer 1118-3B will typically be repeated (for example, 5 times), however single quantum well structures may also be used. Strained quantum well structures can also be used.

The amount of nitrogen content for the respective quantum wells of the PHFET 111 dictates the bandgaps of such quantum wells and the radiation wavelengths that will be absorbed by such quantum wells. For narrowband absorption, the nitrogen content (and corresponding bandgaps) of the respective quantum wells can be controlled to allow for absorption in the desired narrowband. For example, for sensitivity at a wavelength of 0.98 μm, the nitrogen content will be 0%; for sensitivity at a wavelength of 1.3 μm, the nitrogen content will be approximately 2%; and for sensitivity at a wavelength of 1.5 μm, the nitrogen content will be approximately 4%. As is known in the state-of-the-art MBE the introduction of minute quantities of Sb is also helpful at the 1.5 μm wavelength to achieve high quality wells. By adjusting the relative compositions of As versus N and a finite presence of Sb, sensitivity for any wavelength in the near-infrared range between 980 nm and 1650 nm may be realized. Alternatively, for broadband absorption, the nitrogen content (and corresponding bandgaps) of the respective quantum wells can be graded over the quantum wells to allow for sensitivity in the desired wavelength range. For example, by adjusting the relative compositions of As versus N and a finite presence of Sb over the quantum wells of the PHFET 111, sensitivity for a range of near-infrared wavelengths between 980 nm and 1650 nm may be realized.

Following the last barrier layer 1118-3B is a layer 1120 of undoped $Al_{x1}Ga_{(1-x1)}As$ which forms the collector of the PHFET device 111 and has a thickness on the order 3000 Å. All of the layers grown thus far form the PHFET device 111 with the gate contact on the bottom. The layers between the P+ AlGaAs layer 1118-1 and the last barrier layer 1118-3B define the p-type modulation doped quantum well structure 118 of FIG. 1A. Undoped AlGaAs layer 1120 corresponds to the undoped spacer layer 120 of FIG. 1A. Layer 1120 also forms the collector region of the NHFET device 113. Layer 1120 acts to absorb electromagnetic radiation preferably in the visible range between 500 nm to 750 nm as well as in the near-infrared range between 750 nm to 980 nm.

Deposited on layer 1120 are layers that define the quantum wells that form the inversion channel(s) during operation of the NHFET 113, which include a barrier layer 1122-1A of undoped GaAs and a quantum well layer 1122-1B. The quantum well layer 1122-1B may be comprised of a range of compositions. In the preferred embodiment, the quantum well is formed from an InGaAsN composition with the nitrogen content varying from 0% to 5% depending upon the desired wavelength of radiation that will be absorbed by the quantum well. The combination of the barrier layer 1122-1A and quantum well layer 1122-1B will typically be repeated (for example, 5 times), however single quantum well structures may also be used. Strained quantum well structures can also be used.

The amount of nitrogen content for the respective quantum wells of the NHFET 113 dictates the bandgaps of such quantum wells and the radiation wavelengths that will be absorbed by such quantum wells. For narrowband absorption, the nitrogen content (and corresponding bandgaps) of the respective quantum wells can be controlled to allow for absorption in the desired narrowband. For example, for sensitivity at a wavelength of 0.98 μm, the nitrogen content will be 0%; for sensitivity at a wavelength of 1.3 μm, the nitrogen content will be approximately 2%; and for sensitivity at a wavelength of 1.5 μm, the nitrogen content will be approximately 4%. As is known in the state-of-the-art MBE the introduction of minute quantities of Sb is also helpful at the 1.5 μm wavelength to achieve high quality wells. By adjusting the relative compositions of As versus N and a finite presence of Sb, sensitivity for any wavelength in the near-infrared range between 980 nm and 1650 nm may be realized. Alternatively, for broadband absorption, the nitrogen content (and corresponding bandgaps) of the respective quantum wells can be graded over the quantum wells to allow for sensitivity in the desired wavelength range. For example, by adjusting the relative compositions of As versus N and a finite presence of Sb over the quantum wells of the NHFET 113, sensitivity for a range of near-infrared wavelengths between 980 nm and 1650 nm may be realized. It is also contemplated that the quantum wells of the NHFET 113 can have the largest bandgaps as compared to the quantum wells of the PHFET 111, which can have the smallest bandgaps. This configuration provides for sensitivity of longer wavelength radiation in the quantum wells of the PHFET 111 as compared to the NHFET 113 which will have sensitivity to shorter wavelength radiation.

Following the last quantum well layer 1122-1B are three layers 1122-2, 1122-3 and 1124 of $Al_{x1}Ga_{(1-x1)}As$. The parameter x1 is preferably on the order of 15%. Layer 1122-2 is undoped and forms a spacer layer between the quantum wells and the N+ modulation doped layer of the n-type modulation doped quantum well interface 122. Layer 1122-3 is doped N+ type in the form of delta doping and it forms the modulation doped layer of the n-type modulation doped quantum well interface 122. The doping species for layer 1122-2 is preferably carbon (C) to ensure diffusive stability. Layer 1124 is undoped and has a thickness on the order 300 Å. The layers between the first barrier layer 1122-1A and layer 1122-3 correspond to the n-type modulation doped quantum well interface 122 of FIG. 1A. Undoped AlGaAs layer 1124 corresponds to the undoped spacer layer 124 of FIG. 1A. Deposited on layer 1124 is a P+ type layer 1126-1 of $Al_{x2}Ga_{(1-x2)}As$. Preferably, the P+ type $Al_{x2}Ga_{(1-x2)}As$ layer 1126-1 is heavily doped such that it is not depleted in any range of operation of the device, i.e. the total doping in this layer should exceed the total doping charge contained in the modulation doped layer of the n-type modulation doped quantum well structure. A P+-type GaAs layer 1126-2 is deposited on the P+ type $Al_{x2}Ga_{(1-x2)}As$ layer 1126-1. The P+ type GaAs layer 1126-2 enables the formation of ohmic contacts thereto. In this configuration, layer(s) 1126-2 achieves low contact resistance and layer 1126-1 defines the capacitance of the NHFET 113 with respect to the n-type modulation doped quantum well interface. Layers 1124, 1126-1 and 1126-2 serve as part of the gate of the NHFET 113.

Alternatively, the active device structure may be described as a pair of stacked quantum-well-base bipolar transistors formed on the substrate 1110. The first of these is a p-type quantum-well-base bipolar transistor (comprising layers 1114 through 1120) which has one or more p-type modulation doped quantum wells and is positioned with the emitter terminal on the lower side (i.e. on the bottom mirror as just described) and the collector terminal on the upper side. The second of these is an n-type quantum-well-base bipolar transistor (comprising layers 1120 through 1126-2) which has one or more n-type modulation doped quantum wells and is positioned with the emitter terminal on the top side and the collector terminal on the lower side which is the collector of the p-type quantum-well-base bipolar transistor. Therefore a non-inverted n-channel device is stacked upon an inverted p-channel device to form the active device structure. In this configuration, the cathode terminal of the thyristor device corresponds to the emitter electrode of the p-type quantum-well-base bipolar transistor, the p-type quantum well structure (layers 1118-1 though 1118-3B) corresponds to the base region of the p-type quantum-well-base bipolar transistor, spacer layer 1120 corresponds to the collector region of both the p-type quantum-well-base bipolar transistor and the n-type quantum-well-base bipolar transistor, the n-type quantum well structure (layers 1122-1A through 1122-3) corresponds to the base region of the n-type quantum-well-base bipolar transistor, and the anode terminal of the thyristor device correspond to the emitter electrode of the n-type quantum-well-base bipolar transistor.

The structure of FIG. 2 may also be used to realize various electronic devices, including transistor devices (such as n-channel HFET devices, p-channel HFET devices, n-type quantum-well-base bipolar transistors and p-type quantum-well-base bipolar transistors). Such devices are similar to those described in detail in U.S. patent application Ser. No. 10/323,388, filed on Dec. 19, 2002; and U.S. patent application Ser. No. 10/340,942, filed on Jan. 13, 2003; incorporated by reference above in their entireties.

To connect to the anode of the thyristor detector devices of FIG. 2, alignment marks (not shown) are defined by etching, and then a layer of $Si_3N_4$ or $Al_2O_3$ or other suitable dielectric (not shown) is deposited to act as protection for the surface layer and as a blocking layer for subsequent ion implants. The refractory anode terminals 136A and 136B of the thyristor detector devices are deposited and defined preferably via liftoff of metal.

Then mesas are formed to define the active areas for the thyristor detector devices of the array. The active area for a given thyristor detector elements is located under the aperture between the anode terminals 136A, 136B of the given thyristor detector element as shown in FIG. 2. Preferably, the active area mesas are formed by etching down to (or near) N+ type layer 1122-3.

In conjunction with the formation of the active area mesas, an ion implant 171 of N+ type is performed using a photomask that is aligned to the alignments marks to implant n-type ions into the n-type modulation doped quantum well interface of the thyristor detector devices, to thereby form contacts to the n-type modulation doped quantum well interface for the thyristor detector elements. The implant 171 is subsequently metallized as described below to form n-channel injector terminals 137A, 137B for the respective thyristor detector device as shown in FIG. 2.

In addition, an ion implant 172 of P+ type is performed using a photomask that is aligned to the alignments marks to implant p-type ions into the p-type modulation doped quantum well interface of the thyristor detector devices, to thereby form contacts to the p-type modulation doped quantum well interface for the thyristor detector elements. During this operation, mesas are formed by etching preferably down to the spacer layer 1120. The resulting mesas are then subject to P+ ion implant 172. The implant 172 is subsequently metallized as described below to form p-channel injector terminals 138A, 138B for the respective thyristor detector device as shown in FIG. 2.

Connection of the cathode of the thyristor-based pixel elements is made by etching down near the N+ type layer 1114. The exposed portion of the mesa near the N+ type layer 1114 is subsequently metallized as described below to form cathode terminals 139A, 139B for the respective thyristor detector device as shown in FIG. 2.

Next the thyristor detector devices are subjected to a rapid thermal anneal (RTA) of the order of 900° C. or greater to activate all implants. Then the thyristor detector devices are isolated from one another by etching down to the semi-insulating substrate 1110. Note that etch down to the semi-insulating substrate 1110 can be omitted. In this scenario, isolation can be provided by an ion implant (for example, $O_2$ ions).

The next step in the fabrication is the deposition (preferably via lift off) of metal contacts. These contacts come in three forms. One is a metal layer (preferably comprising an n-type Au alloy metal such as AuGe/Ni/Au) that forms the cathode terminal electrodes 139A, 129B as shown in FIG. 2. The second is a metal layer (preferably comprising a p-type Au metal alloy such as AuZn/Cr/Au) deposited on the P+ type implant 172 to form the p-channel injector terminal electrodes 138A, 138B as shown in FIG. 2. The third is the metal layer (preferably comprising an n-type Au alloy metal such as AuGe/Ni/Au) deposited on the N+ type implant 171 to form the n-channel injector terminal electrodes 137A, 137B as shown in FIG. 2. Preferably, the metallization of the cathode terminal electrodes and the n-channel injector terminal electrodes is performed as a single lift-off operation.

Note that in alternative embodiments, the GaAs substrate 1110 can be doped N+ and thus intrinsically realize the N+ type layer 1114. In this configuration, connection to the N+substrate 1110 of the cathode can be made on the bottom side of the N+substrate 1110 by metallization thereon. Isolation can be provided by an ion implant (for example, $O_2$ ions).

Also note that the operations described above to realize a thyristor detector device from the multilayer structure of FIG. 2 are readily adaptable to realize a wide variety of electronic devices (such as HFET transistors, quantum-well-base transistors, etc, and associated logic and signal processing circuitry) from the multilayer structure of FIG. 2. Such devices are similar to those described in detail in U.S. patent application Ser. No. 10/323,388, filed on Dec. 19, 2002; and U.S. patent application Ser. No. 10/340,942, filed on Jan. 13, 2003; incorporated by reference above in their entireties.

The thyristor detector device of FIG. 2 is adapted to operate over successive cycles each including a sequence of two distinct modes: a setup mode and a signal acquisition mode. As described above, during the setup mode, the n-type quantum well interface 122 and/or the p-type quantum well interface 118 is(are) substantially emptied of charge. Such operations reset the thyristor detector device into an OFF state if it was switched ON during the signal acquisition mode of the previous cycle. During signal acquisition mode, photocurrent is generated by the thyristor detector device in response to the absorption of incident electromagnetic radiation therein. The photocurrent can induce the thyristor detector device to switch from an OFF state to an ON state. Once switched into the ON state, the thyristor detector device remains in the ON state until it is reset in the setup mode of the next cycle. The OFF/ON state of the thyristor detector device at the end of signal acquisition mode produces an output digital electrical data that corresponds to the amount of incident radiation absorbed by the thyristor detector device during the signal acquisition mode of the current cycle.

In the preferred embodiment, the n-type and p-type modulation doped quantum well interfaces 122, 118 of the thyristor devices of the array absorb electromagnetic radiation in the near-infrared range from 980 nm to 1650 nm and the undoped spacer layer 120 disposed between the n-type and p-type modulation doped quantum well interfaces absorbs electromagnetic radiation in the visible range from 500 nm to 750 nm in addition to the near-infrared range from 750 nm to 980 nm, thus providing spectral sensitivity of the thyristor detector devices over a broad range from 500 nm to 1650 nm.

Figure 3A:
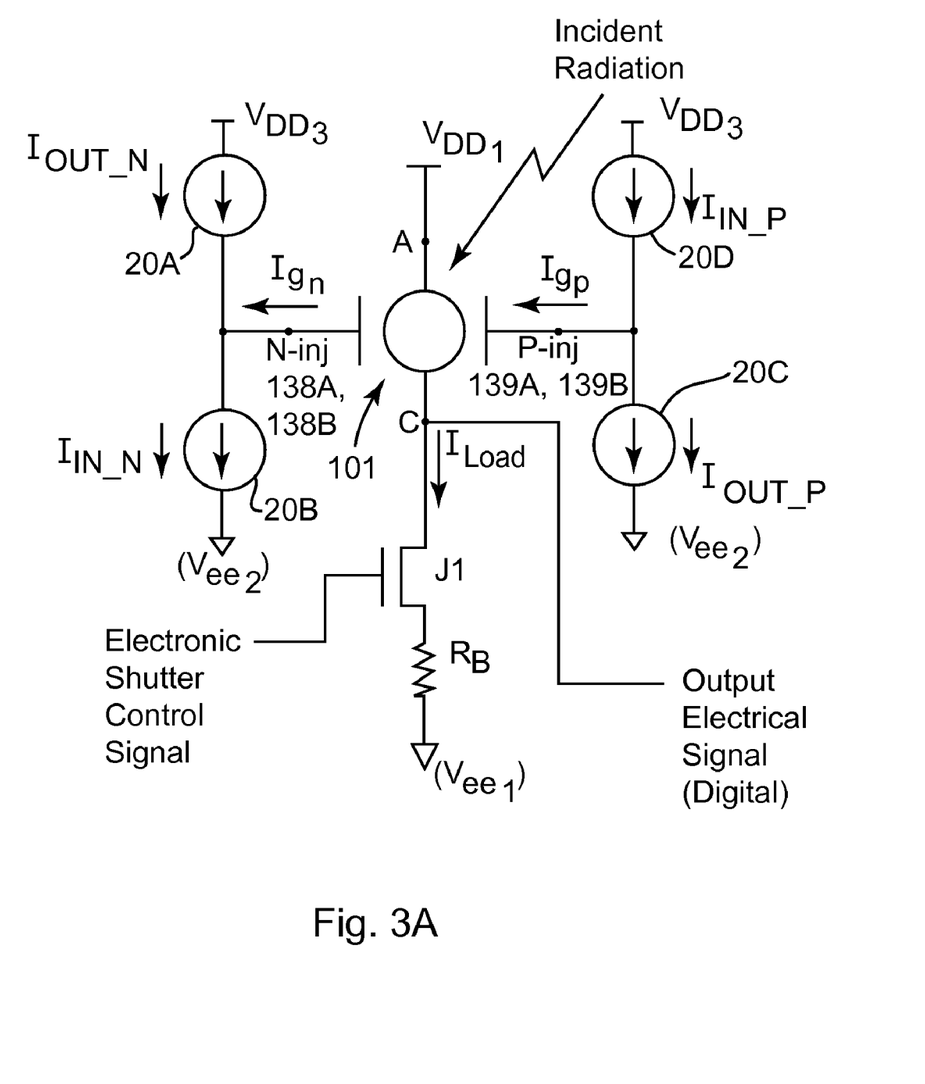
FIG. 3A is a functional block diagram illustrating an exemplary embodiment of a thyristor detector device and supporting electronic circuitry in accordance with the present invention.
Figure 3B:
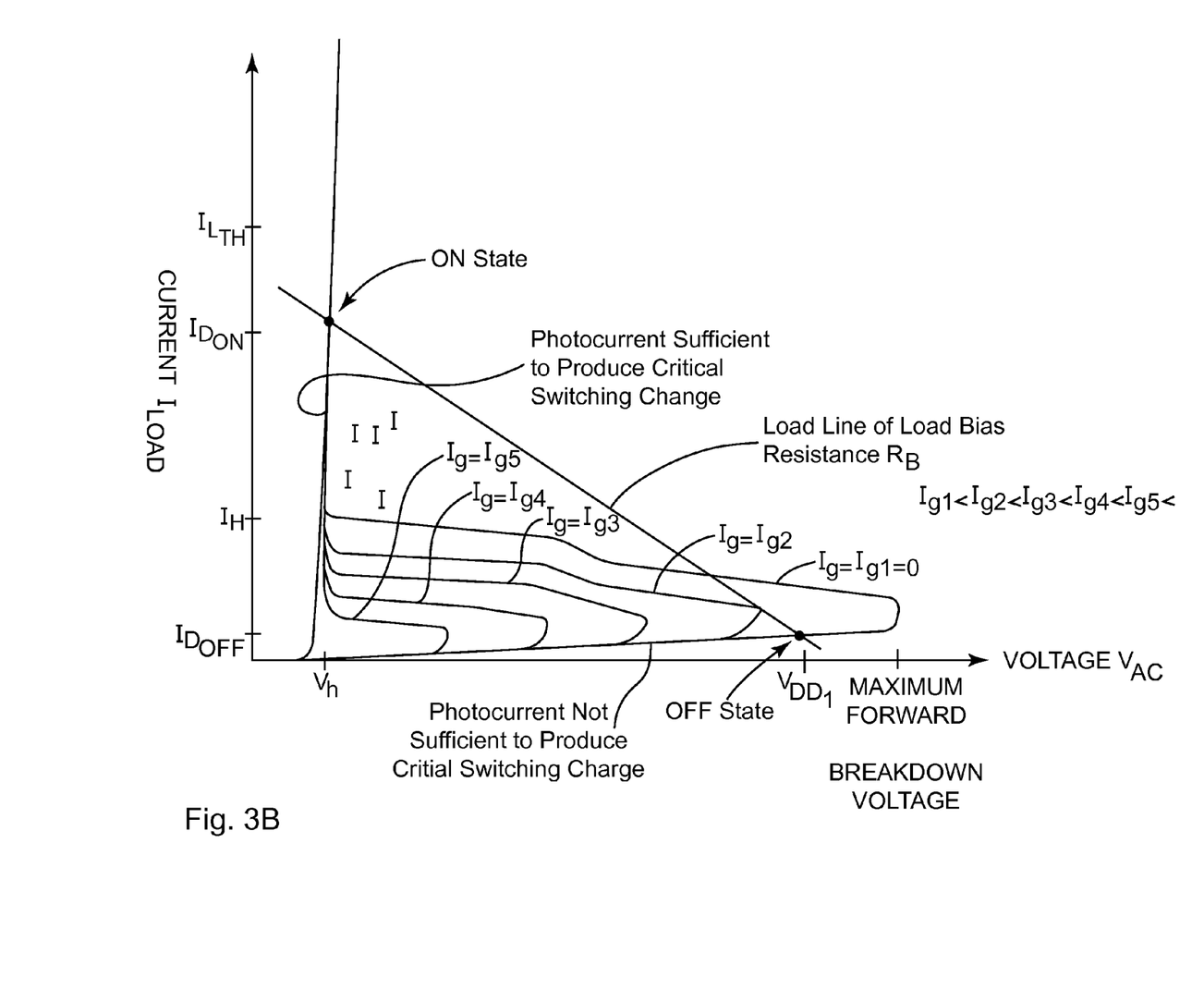
FIG. 3B illustrates the operational characteristics of the thyristor detector device of FIG. 3A.

FIGS. 3A and 3B illustrate the operational characteristics of the thyristor detector device of FIGS. 1A, 1B and 2. The thyristor detector device 101 switches from a non-conducting/OFF state (where the current $I_{LOAD}$ is substantially zero) to a conducting/ON state (where current $I_{LOAD}$ is substantially greater than zero) when: i) the anode terminal electrode (A) is forward biased (e.g. biased positively) with respect to the cathode terminal electrode (C); and ii) charge is introduced into the n-type modulation doped quantum well interface 122 and/or the p-type modulation doped quantum well interface 118 that is greater than the critical switching charge $Q_{CR}$, which is that charge that reduces the forward breakdown voltage such that no off state bias point exists. The critical switching charge $Q_{CR}$ is unique to the geometries and doping levels of the device. The switching voltage of the device (i.e., the voltage that provides the critical switching charge $Q_{CR}$) varies over the p-channel injector current $I_{g\_p}$ and the n-channel injector current $I_{g\_n}$, collectively referred to as $I_g$, as shown in FIG. 3B. The device switches from the conducting/ON state (where the current $I_{LOAD}$ is substantially greater than zero) to a non-conducting/OFF state (where current $I_{LOAD}$ is substantially zero) when the current $I_{LOAD}$ through the device falls below the hold current $I_H$ of the device for a sufficient period of time such that the charge in the n-type modulation doped quantum well interface 122 and/or the p-type modulation doped quantum well interface 118 decreases below the holding charge $Q_H$, which is the critical value of the channel charge which will sustain holding action.

In the configuration illustrated in FIG. 3A, the anode terminal electrode (A), which corresponds to the anode terminal electrodes 136A, 136B of FIG. 2, is forward biased (e.g. biased positively) with respect to the cathode terminal electrode (C), which corresponds to the cathode terminal electrodes 139A, 139B of FIG. 2. Bias Current Source 20A provides a bias current $I_{OUT\_N}$ that draws charge (e.g., electrons) from the n-type modulation doped quantum well interface 122 electrically connected to the n-channel injector terminal electrode (138A, 138B). Bias Current Source 20B provides a bias current $I_{IN\_N}$ that injects charge (e.g., electrons) into the n-type modulation doped quantum well interface 122 electrically connected to the n-channel injector terminal electrode (138A, 138B). Bias Current Source 20C provides a bias current $I_{OUT\_P}$ that draws charge (e.g., holes) from the p-type modulation doped quantum well interface 118 electrically connected to the p-channel injector terminal electrode (139A, 138B). Bias Current Source 20D provides a bias current $I_{IN\_P}$ that injects charge (e.g., holes) into the p-type modulation doped quantum well interface 118 electrically connected to the p-channel injector terminal electrode (139A, 138B).

For the case where bias current source 20A is providing an electron current $I_{OUT\_N}$ drawing on the n-channel injector terminal electrode, the absorption of incident radiation can produce photocurrent in excess of such electron current. In the event that such excess photocurrent produces the critical switching charge $Q_{CR}$ in the n-type modulation doped quantum well interface 122, the thyristor device will switch to its ON state. Similarly, for the case where bias current source 20B is providing an electron current $I_{IN\_N}$ supplied to the n-channel injector terminal electrode, the absorption of incident radiation can produce photocurrent that sums with the bias current $I_{IN\_N}$. In the event that such current sum produces the critical switching charge $Q_{CR}$ in the n-type modulation doped quantum well interface 122, the thyristor device will switch to its ON state.

For the case where bias current source 20C is providing a hole current $I_{OUT\_P}$ drawing on the p-channel injector terminal electrode, the absorption of incident radiation can produce photocurrent in excess of such hole current. In the event that such excess photocurrent produces the critical switching charge $Q_{CR}$ in the p-type modulation doped quantum well interface 118, the thyristor device will switch to its ON state. Similarly, for the case where bias current source 20D is providing an electron current $I_{IN\_P}$ supplied to the p-channel injector terminal electrode, the absorption of incident radiation can produce photocurrent that sums with the bias current $I_{IN\_P}$. In the event that such current sum produces the critical switching charge $Q_{CR}$ in the p-type modulation doped quantum well interface 118, the thyristor device will switch to its ON state.

A load bias resistance $R_{BD}$ dictates the load current $I_{DON}$ in the ON state and the load current $I_{DOFF}$ in the OFF state. In the configuration of FIG. 3B, the load bias resistance $R_{BD}$ provides a load current $I_{DON}$ in the ON state well above the hold current ($I_H$) and a load current $I_{DOFF}$ in the OFF state well below the hold current ($I_H$) as shown. In this configuration, an output digital electrical signal whose logic level represents the detection (or non-detection) of incident radiation over the signal acquisition mode of the current cycle is generated at the cathode terminal electrode of the thyristor detector device.

The transistor J1 operates as an electronic shutter that selectively couples and decoupled the cathode terminal electrode to ground through the bias load resistance $R_B$, to thereby enable and disable conduction from the cathode terminal. During the signal acquisition mode of the cycle, the transistor J1 is switched ON to selectively couple the cathode terminal electrode to ground through the bias load resistance $R_B$, to thereby enable conduction from the cathode terminal. During the setup mode of the cycle, the transistor J1 is switched OFF to selectively decouple the cathode terminal electrode to ground through the bias load resistance $R_B$, to thereby disable conduction from the cathode terminal. Moreover, the bias current source 20A is operated to draw charge (electrons) from the n-type modulation doped quantum well interface 122 in order to empty it of free electrons. Similarly, the bias current source 20C is operated to draw charge (holes) from the p-type modulation doped quantum well interface 118 in order to empty it of free holes.

Note that the bias current sources 20A, 20B, 20C and 20D are optional and the amount of bias current supplied by such bias current sources (if any) provide for control over the sensitivity of the detection operations of the thyristor detector device during the signal acquisition mode of each cycle. It is contemplated that the bias current sources can be realized by electrically-controlled bias current circuitry (e.g., voltage-controlled bias current source circuitry, current-controlled bias current source circuitry, etc.) that can be selectively activated and controlled by electrical signals supplied thereto.

Figure 4:
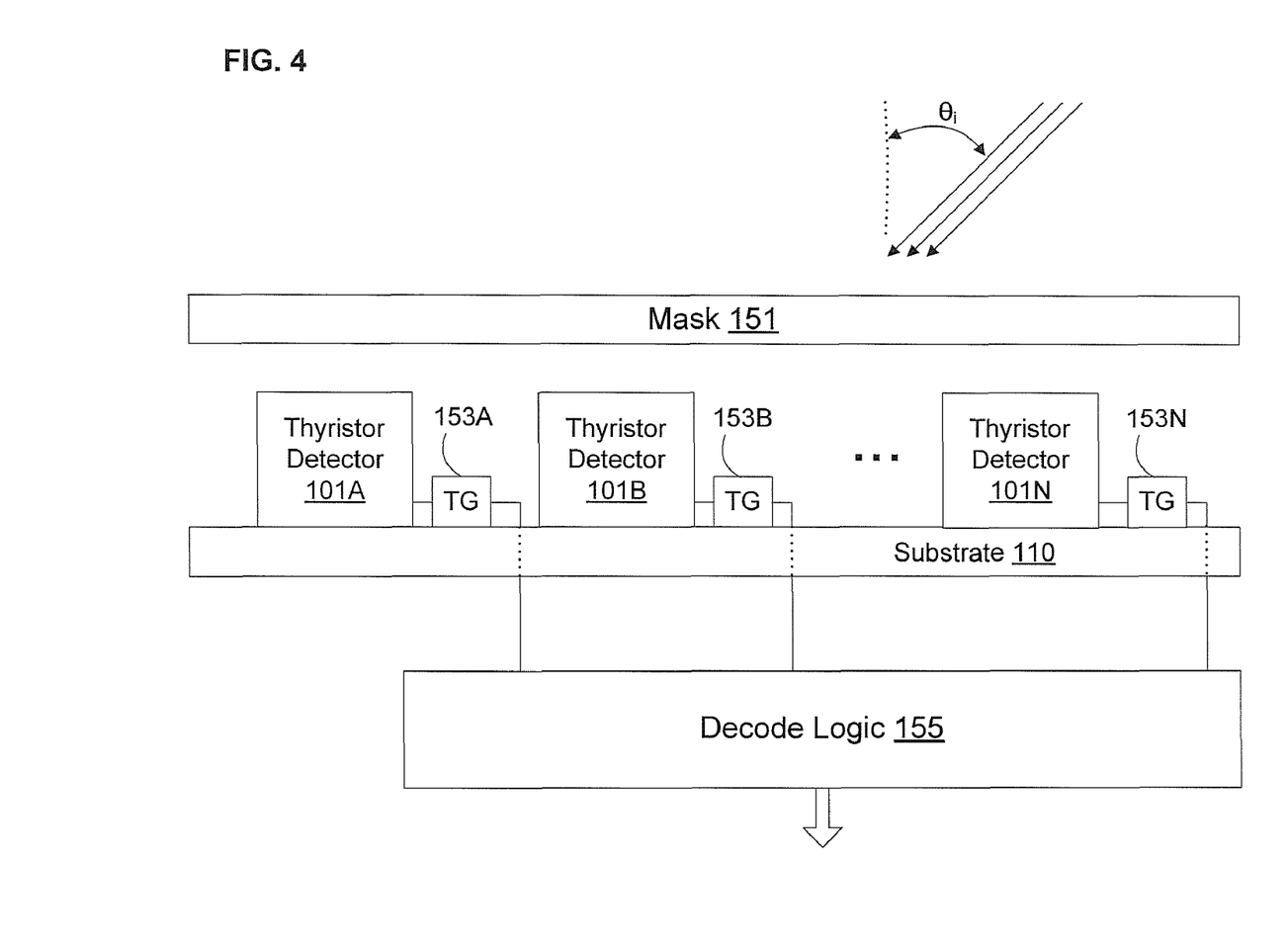
FIG. 4 is a schematic diagram illustrating the system architecture of a High Angular Resolution Laser Irradiation Detector (HARLID) employing an array of thyristor detector devices in accordance with the present invention.

The thyristor detector elements as described above may be utilized in a variety of applications. For example, FIG. 4 illustrates an array of thyristor detector devices (101A, 101B, . . . 101N) that are fabricated on a substrate 110 as part of a monolithic integrated circuit for high angular resolution laser irradiation detection (HARLID). A mask 151 is provided that blocks incident radiation within the spectral range of interest (e.g., between 500 nm and 1650 nm). The mask 151 includes multiple apertures positioned above the array of thyristor detector devices (101A, 101B, . . . 101N). The apertures allow the incident radiation to pass through the mask 151 to the thyristor detector devices (101A, 101B, . . . 101N), which are adapted to perform successive radiation detection cycles each including a setup mode and a signal acquisition mode as described herein. The outputs of the thyristor detector devices (101A, 101B, . . . 101N) are supplied to decode logic 155 via corresponding transmission gates (153A, 153B, . . . 153N). The transmission gates (153A, 153B, . . . 153N), which are preferably realized by HFET transistor devices that are integrally formed on the substrate 110, are activated by enable signals (not shown) supplied thereto at the end of the signal acquisition mode of each cycle. The angle-of-arrival ($\theta_i$) of the incident laser beam is determined by the decode logic 155 from the output signals of the thyristor detector devices (101A, 101B, . . . 101N) and the areas where the apertures of the mask 151 are imaged onto the thyristor detector devices (101A, 101B, . . . 101N) as is well known in the art. The decode logic 155 is preferably realized by HFET transistor devices that are integrally formed on the substrate 110. It is also contemplated that the mask 151 can be integrally formed on the substrate 110 as part of the monolithic integrated circuit (preferably by material deposition and etching of the apertures of the mask 151). It is also contemplated that an antireflective coating can cover the apertures of the mask 151 as is well known in the art.

In the preferred embodiment, the n-type and p-type modulation doped quantum well interfaces 122, 118 of the thyristor devices of the array absorb electromagnetic radiation in the near-infrared range from 980 nm to 1650 nm and the undoped spacer layer 120 disposed between the n-type and p-type modulation doped quantum well interfaces absorbs electromagnetic radiation in the visible range from 500 nm to 750 nm in addition to the near-infrared range from 750 nm to 980 nm, thus providing spectral sensitivity of the thyristor detector devices over a broad range from 500 nm to 1650 nm.

It is contemplated that the thyristor detectors of the array can be arranged as a linear array (with a constant active area size over the thyristor detector devices of the array) positioned under a mask comprising a plurality of two-dimensional apertures (where size of the apertures vary over rows of such apertures).

In alternate embodiment, the thyristor detectors of the array can be arranged as a two dimensional array of thyristor detector devices with variable active area size over the thyristor detector devices of the two dimensional array. The thyristor detector devices are positioned under a linear shadow mask with a single slot aperture that allows incident radiation to pass to the thyristor detector devices. The angle-of-arrival ($\theta_i$) of the incident laser beam is determined by decode logic from the output signals of the variable size thyristor detector devices as is well known in the art.

It is also contemplated that the thyristor detectors of the array, the mask and the decode logic of the HARLID of FIG. 4 can be arranged to measure angle-of-arrival in two orthogonal directions.

It is also contemplated that the sensitivity of the thyristor detector devices can be adjusted over successive images cycles in order to detect high power sources as well as lower power sources. It is contemplated that the system can detect the time-to-switch period (i.e., the time period from the start of the signal acquisition mode to the time that the thyristor switches ON, if any) for the thyristor detector devices of the array. This time-to-switch period can be used to adjust the bias current applied to the modulation doped quantum well interfaces of the device. For example, if the time-to-switch is less than a predetermined minimum time period, the bias currents can be adjusted to reduce the sensitivity of the thyristor detector devices of the array. Alternatively, if the time-to-switch is greater than a predetermined maximum time period (or does not occur at all), the bias currents can be adjusted to increase the sensitivity of the thyristor detector devices of the array.

In an alternate embodiment, the thyristor detector devices as described herein can be fabricated within an integrally formed resonant cavity for increased sensitivity. A bottom distributed reflective mirror is formed on the substrate under the active device structure. A top dielectric mirror is formed over the p-type layer(s) of the device. Incident radiation enters the resonant cavity in a vertical direction through an optical aperture (not shown) in the top surface (or bottom surface) of the device. The optical path length between the bottom DBR mirror and top dielectric mirror preferably represents an integral number of ½ wavelengths at the designated wavelength. Preferably, this optical path length is controlled by adjusting the thickness of one or more of the layers therebetween to enable this condition.

There have been described and illustrated herein several embodiments of an array of thyristor detector devices and applications based thereon. While particular embodiments of the invention have been described, it is not intended that the invention be limited thereto, as it is intended that the invention be as broad in scope as the art will allow and that the specification be read likewise. Thus, while particular materials, fabrication processes, circuit elements, and circuit architectures have been disclosed, it will be understood the others can be used as well. In addition, while particular device structures have been disclosed, it will be appreciated that others can be used as well. It will therefore be appreciated by those skilled in the art that yet other modifications could be made to the provided invention without deviating from its spirit and scope as claimed.

What is claimed is:

1. An apparatus comprising:
   an array of thyristor devices each including complementary first-type and second-type modulation doped quantum well interfaces that are formed on a common substrate and that are spaced apart from one another, wherein each given thyristor device is adapted to operate in each of the following modes:
   i) a setup mode whereby charge is emptied from said first-type and second-type modulation doped quantum well interfaces for said given thyristor device; and
   ii) a signal acquisition mode whereby electromagnetic radiation within a predetermined wavelength is absorbed by said given thyristor device over a time period producing photocurrents that selectively switch said given thyristor device from an OFF state to an ON state in accordance with power of the electromagnetic radiation within the predetermined wavelength range that is received at said given thyristor device;
   a mask that blocks incident radiation within a spectral range of interest, said mask including multiple apertures positioned above the thyristor devices;
   a plurality of transmission gates connected to the thyristor devices for selectively transmitting output signals generated by the thyristor devices; and
   decode logic, operably coupled to the plurality of transmission gates via a plurality of signal paths therebetween, for detecting angle of incidence of an incoming incident radiation based on the output of the thyristor devices supplied via the plurality of transmission gates.

2. An apparatus according to claim 1, wherein said plurality of transmission gates are integrally formed on the substrate.

3. An apparatus according to claim 1, wherein:
   the thyristor devices are arranged as a linear array with a constant active area size over the thyristor devices of the linear array; and
   the mask comprises a plurality of two-dimensional apertures whose size vary over rows of such apertures.

4. An apparatus according to claim 1, wherein:
   the thyristor devices are arranged as a two dimensional array with variable active area size over the thyristor devices of the two dimensional array, and
   the mask comprises a single slot aperture.

5. An apparatus according to claim 1, wherein:
   the thyristor devices, the mask and the decode logic are arranged to measure angle-of-arrival in two orthogonal directions.

6. An apparatus according to claim 1, wherein:
   the mask is integrally formed with the thyristor devices.

7. An apparatus according to claim 1, wherein:
   the decode logic is realized by transistors integrally formed on the substrate.

8. An apparatus according to claim 1, wherein:
   each given thyristor device is adapted to perform a sequence of cycles, each cycle including said setup mode and said signal acquisition mode.

9. An apparatus according to claim 8, wherein:
   in the event that said given thyristor device switches to said ON state during the signal acquisition mode of a given cycle, said given thyristor device is switched to the OFF state in the setup mode of the next cycle.

10. An apparatus according to claim 1, wherein:
    each given thyristor device comprises an anode terminal, injector control terminals coupled to corresponding complementary modulation doped quantum well interfaces, and a cathode terminal.

11. An apparatus according to claim 10, further comprising:
    bias load circuitry operably coupled to a current path between said anode terminal and said cathode terminal.

12. An apparatus according to claim 11, wherein:
    said bias load circuitry is selectively coupled to the current path between said anode terminal and said cathode terminal in the signal acquisition mode and selectively isolated from the current path between said anode terminal and said cathode terminal in the setup mode.

13. An apparatus according to claim 12, further comprising:
    first bias current source circuitry operably coupled to at least one of said complementary modulation doped quantum well structures in the setup mode.

14. An apparatus according to claim 13, further comprising:
    second bias current source circuitry operably coupled to at least one of said complementary modulation doped quantum well structures in the signal acquisition mode for adjusting sensitivity of said given thyristor device.

15. An apparatus according to claim 14, wherein:
    the array of thyristor devices, said bias load circuitry, said first bias current source circuitry, and said second bias current source circuitry are all realized by devices integrally formed on the substrate.

16. An apparatus according to claim 15, wherein:
    said devices are formed from an epitaxial structure deposited on the substrate.

17. An apparatus according to claim 16, wherein:
    said epitaxial structure comprises a III-V material system.

18. An apparatus according to claim 1, wherein:
each given thyristor device includes an undoped spacer layer disposed between said first-type modulation doped quantum well interface and said second-type modulation doped quantum well interface.

19. An apparatus according to claim 18, wherein:
said first-type modulation doped quantum well interface and said second-type modulation doped quantum well interface are adapted to absorb electromagnetic radiation in a first predetermined wavelength range and said undoped spacer layer is adapted to absorb electromagnetic radiation in a second predetermined wavelength range.

20. An apparatus according to claim 19, wherein:
said first predetermined wavelength range includes wavelengths between 980 nm and 1650 nm, and said second predetermined wavelength range includes wavelengths between 500 nm and 980 nm.

21. An apparatus according to claim 19, wherein:
each given thyristor device includes
at least one first-type ion implant in electrical contact with said first-type modulation doped quantum well interface, and
second-type ions implants in electrical contact with said second-type modulation doped quantum well interface.

22. An apparatus according to claim 21, wherein:
each given thyristor device includes
at least one first channel injector terminal formed from a metal layer deposited on said at least one first-type ion implant, and
at least one second channel injector terminal formed from a metal layer deposited on said second-type ion implants.

23. An apparatus according to claim 22, wherein:
each given thyristor device includes an anode, an anode terminal electrically coupled to said anode, a cathode, and a cathode terminal electrically coupled to said cathode.

24. An apparatus according to claim 23, further comprising:
circuitry, electrically coupled to at least one said first and second channel injectors for the given thyristor device in the setup mode, that empties free charge from the corresponding modulation doped quantum well interface.

25. An apparatus according to claim 23, further comprising:
circuitry, electrically coupled to at least one said first and second channel injectors for the given thyristor device in the signal acquisition mode, that supplies a bias current that adjusts sensitivity of the given thyristor device.

26. An apparatus according to claim 23, further comprising:
shutter circuitry, electrically coupled to said cathode terminal for the given thyristor device, that selectively operates to couple said cathode terminal to a load element or place said cathode terminal in a high-impedance state.

27. An apparatus according to claim 23, wherein:
said shutter circuitry couples said cathode terminal for the given thyristor device to the load element during the signal acquisition mode.

28. An apparatus according to claim 23, wherein:
said shutter circuitry places said cathode terminal for the given thyristor device in a high-impedance state during the setup mode.

* * * * *